(12) United States Patent
Kao et al.

(10) Patent No.: US 7,928,461 B2
(45) Date of Patent: Apr. 19, 2011

(54) LIGHT-EMITTING DIODE

(75) Inventors: Lin-Chieh Kao, Caotun Town (TW);
Shu-Ying Yang, Gangshan Town (TW)

(73) Assignee: Huga Optotech, Inc., Taichung (TW)

( * ) Notice: Subject to any disclaimer, the term of this patent is extended or adjusted under 35 U.S.C. 154(b) by 236 days.

(21) Appl. No.: 12/418,105

(22) Filed: Apr. 3, 2009

(65) Prior Publication Data
US 2010/0193812 A1     Aug. 5, 2010

(30) Foreign Application Priority Data
Feb. 5, 2009  (TW) ............................... 98103744 A

(51) Int. Cl.
*H01L 33/00*     (2010.01)
(52) U.S. Cl. .................... 257/98; 257/E33.068
(58) Field of Classification Search ............ 257/79–103, 257/E33.067, E33.068, E33.069
See application file for complete search history.

(56) References Cited

U.S. PATENT DOCUMENTS

2005/0082562 A1* 4/2005 Ou et al. ........................ 257/103
2008/0061308 A1* 3/2008 Yoon ............................... 257/94

* cited by examiner

*Primary Examiner* — Minh-Loan T Tran
*Assistant Examiner* — Kevin Quinto
(74) *Attorney, Agent, or Firm* — Chun-Ming Shih

(57) ABSTRACT

The invention discloses a light-emitting diode which comprises a substrate, a first conducting-type semiconductor layer, plural pillars, a transparent insulating material, an illuminating layer, a second conducting-type semiconductor layer, a first transparent conducting layer and a second transparent conducting layer. The first conducting-type semiconductor layer is formed on the substrate, and the top surface of the first conducting-type semiconductor layer comprises a first region and a second region surrounded by the first region. The pillars are formed on the first region. The transparent insulating material is filled in the gaps between the pillars to be as high as the pillars. The illuminating layer is formed on the second region, and the second conducting-type semiconductor layer is formed on the illuminating layer. The first transparent conducting layer is formed on the second conducting-type semiconductor layer, and the second transparent conducting layer is formed on a top surface of the pillars and the transparent insulating material.

24 Claims, 13 Drawing Sheets

US 7,928,461 B2

LIGHT-EMITTING DIODE

BACKGROUND OF THE INVENTION

1. Field of the Invention

The present invention relates to a light-emitting diode with high lighting efficiency and a fabrication thereof.

2. Description of the Prior Art

Nowadays, light-emitting diodes, have been used in a wide variety of applications, e.g., key systems, back light modules of mobile phone monitors, illuminating systems of vehicles, decorative lamps, and remote controls. To ensure high functional reliability as great as possible and a low power requirement of the light-emitting diodes, the lighting efficiency is required for the devices.

Please refer to FIG. 1. FIG. 1 illustrates a light-emitting diode 1 in the prior art. As shown in FIG. 1, the light-emitting diode 1 includes a substrate 10, an N-type GaN layer 11, a light-emitting layer 12, a P-type GaN layer 13, and two electrodes 14, 15. For the work of the light-emitting diode 1, the N-type GaN layer 11 and the P-type GaN layer 13 must be electrically conducted with each other, which is realized by the electrode 15 formed on the P-type GaN layer 13 and the electrode 14 formed on the N-type GaN layer 11.

In principle, the lighting efficiency of a light-emitting diode is determined both by the internal quantum efficiency and light-extraction efficiency. The internal quantum efficiency is determined by the material property and quality. The light-extraction efficiency refers to the proportion of radiation emitted from the interior of the device the device into surrounding air or encapsulating epoxy. Although many light-emitting diodes with various structures have been presented, how to enhance the lighting efficiency and the light-extraction efficiency of light-emitting diodes is still an significant issue.

SUMMARY OF THE INVENTION

One scope of the invention is to provide a light-emitting diode with high lighting efficiency.

According to an embodiment of the invention, the light-emitting diode includes a substrate, a first conducting-type semiconductor layer, plural pillars, a transparent insulating material, a light-emitting layer, a second conducting-type semiconductor layer, a first transparent conducting layer, a second transparent conducting layer, a first electrode, and a second electrode.

The first conducting-type semiconductor layer is formed on the substrate and has a top surface including a first region and a second region surrounded by the first region. The plural pillars are formed on the first region. The transparent insulating material is filled in the gaps between the pillars to be as high as the plural pillars.

The light-emitting layer is formed on the second region, the second conducting-type semiconductor layer is formed on the light-emitting layer, and the first transparent conducting layer is formed on the second conducting-type semiconductor layer. The second transparent conducting layer is formed on a top surface of the pillars and the transparent insulating material. The first electrode is formed on the first transparent conducting layer, and the second electrode is formed on the second transparent conducting layer.

Another scope of the invention is also to provide a light-emitting diode with high lighting efficiency.

According to an embodiment of the invention, the light-emitting diode includes a substrate, a first conducting-type semiconductor layer, plural pillars, a light-emitting layer, a second conducting-type semiconductor layer, a first transparent conducting layer, a second transparent conducting layer, a first electrode, and a second electrode.

The first conducting-type semiconductor layer is formed on the substrate and has a top surface including a first region and a second region surrounded by the first region. The plural pillars are formed on the first region.

The light-emitting layer is formed on the second region, the second conducting-type semiconductor layer is formed on the light-emitting layer, and the first transparent conducting layer is formed on the second conducting-type semiconductor layer. The second transparent conducting layer is coated on the pillars and on the first region. The first electrode is formed on the first transparent conducting layer, and the second electrode is formed on the second transparent conducting layer.

Compared to the prior art, the light-emitting diode according to the invention has increased light-extraction efficiency with the aforesaid plural pillars. Further, the transparent insulating material filled in the gaps between the pillars not only reduces the total reflection of light inside the light-emitting diode, but also enhances the anti-destruction strength of the device. Moreover, coating the transparent conducting layer on the pillars makes the driving current of the light-emitting diode flow into the pillars and thus spread around the primary illuminating region, which contributes to better current-spreading, more uniform illumination, and decreased instant discharge.

The advantage and spirit of the invention may be understood by the following recitations together with the appended drawings.

BRIEF DESCRIPTION OF THE APPENDED DRAWINGS

DETAILED DESCRIPTION OF THE INVENTION

Figure 1:
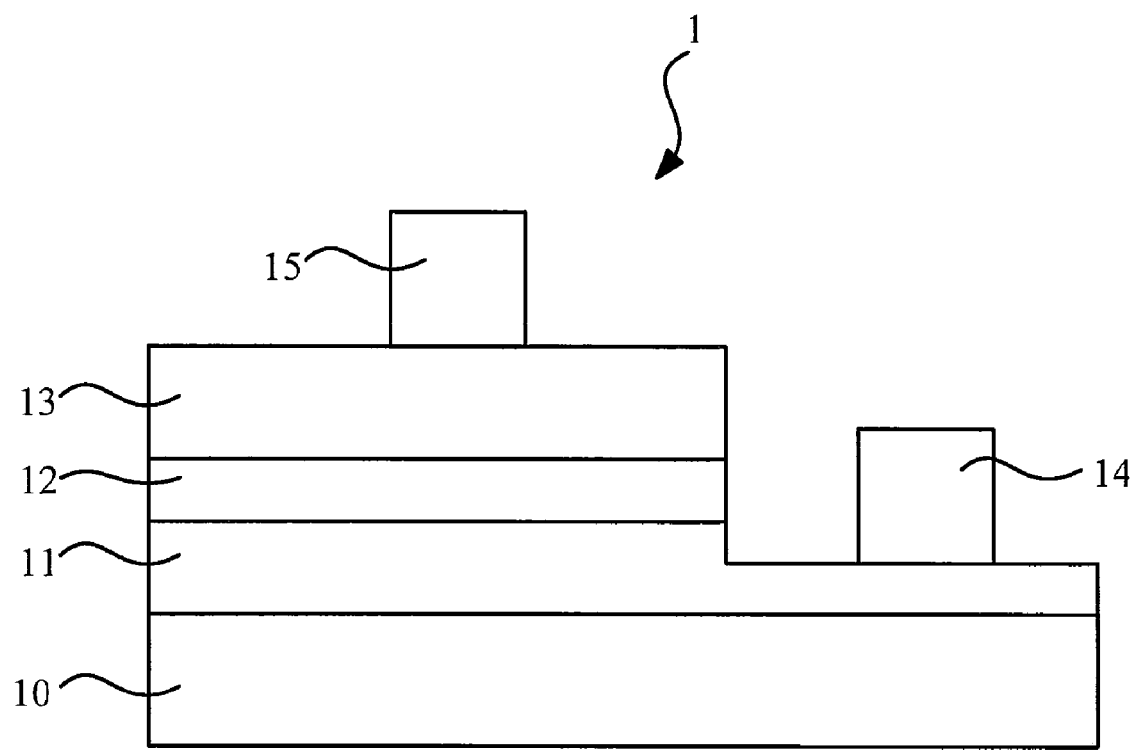
FIG. 1 illustrates a light-emitting diode in the prior art.
Figure 2A:
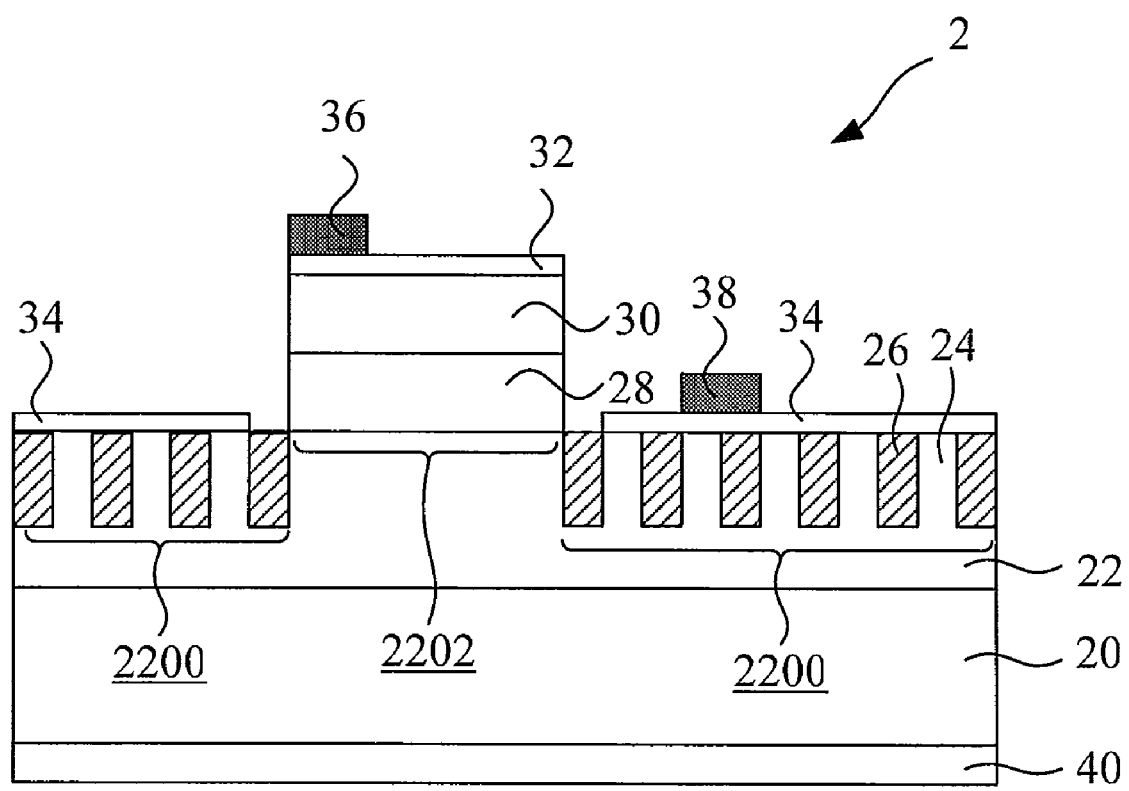
FIG. 2A is a sectional view illustrating a light-emitting diode according to an embodiment of the invention.

Please refer to FIG. 2A. FIG. 2A is a sectional view illustrating a light-emitting diode 2 according to an embodiment of the invention.

As shown in FIG. 2A, the light-emitting diode 2 includes a substrate 20, a first conducting-type semiconductor layer 22, plural pillars 24, a transparent insulating material 26, a light-emitting layer 28, a second conducting-type semiconductor layer 30, a first transparent conducting layer 32, a second transparent conducting layer 34, a first electrode 36, and a second electrode 38. In practical applications, the substrate 20 thereon defines a dicing path (not shown in FIG. 2A), and most of the plural pillars 24 are located substantially over the dicing path.

As shown in FIG. 2A, the first conducting-type semiconductor layer 22 is formed on the substrate 20 and has a top surface including a first region 2200 and a second region 2202 surrounded by the first region 2200. It should be explained that the second region 2202 is where the light-emitting layer 28 is deposited, and the first region 2200 is the remaining region of the top surface which is distinct from and surrounds the second region 2202. The plural pillars 24 are formed on the first region 2200. The transparent insulating material 26 is filled in the gaps between the pillars 24 to be as high as the plural pillars 24. In addition, the plural pillars 24 and the first conducting-type semiconductor layer 22 may be made of the same material.

As shown in FIG. 2A, the light-emitting layer 28 is formed on the second region 2202, the second conducting-type semiconductor layer 30 is formed on the light-emitting layer 28, and the first transparent conducting layer 32 is formed on the second conducting-type semiconductor layer 30.

In practical applications, each the first conducting-type semiconductor layer 22, the light-emitting layer 28 and the second conducting-type semiconductor layer 30 is made of a nitride material. In a preferred embodiment, the refractive index of the transparent insulating material 26 is between that of air and that of the nitride material, which enhances the refraction (i.e. reduces the total reflection) of light emitted from the light-emitting layer with the mechanism of graded refractive index distribution.

As shown in FIG. 2A, the second transparent conducting layer 34 is formed on a top surface of the pillars 24 and the transparent insulating material 26. The first electrode 36 is formed on the first transparent conducting layer 32, and the second electrode 38 is formed on the second transparent conducting layer 34. In a preferred embodiment, the light-emitting diode 2 further includes a reflective layer 40, formed on the bottom surface of the substrate 20, which enables the light-emitting diode 2 to emit light upwardly.

Figure 2B:
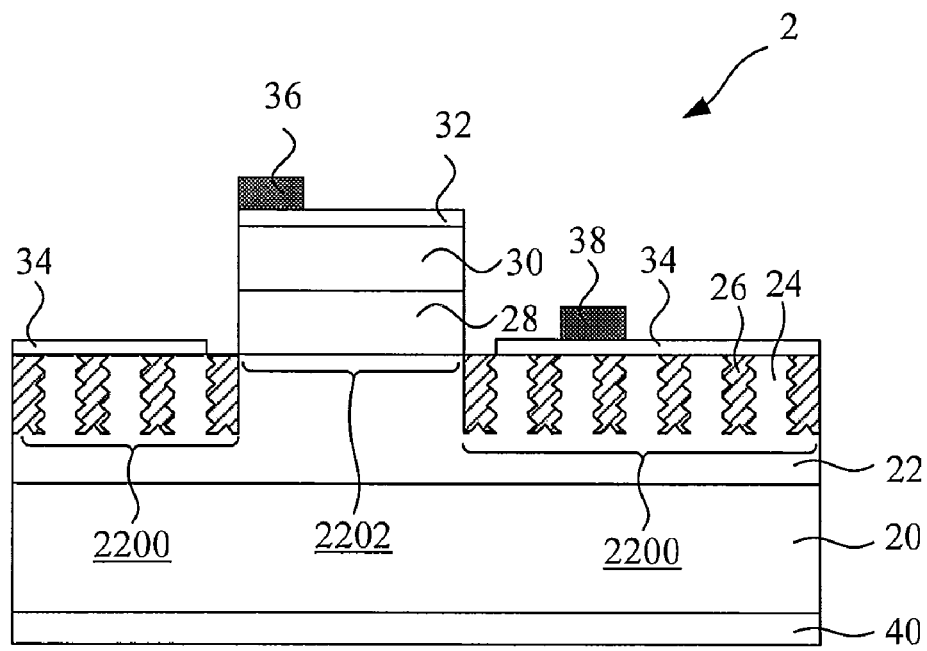
FIG. 2B is a sectional view illustrating the roughened surfaces of the plural pillars.
Figure 2C:
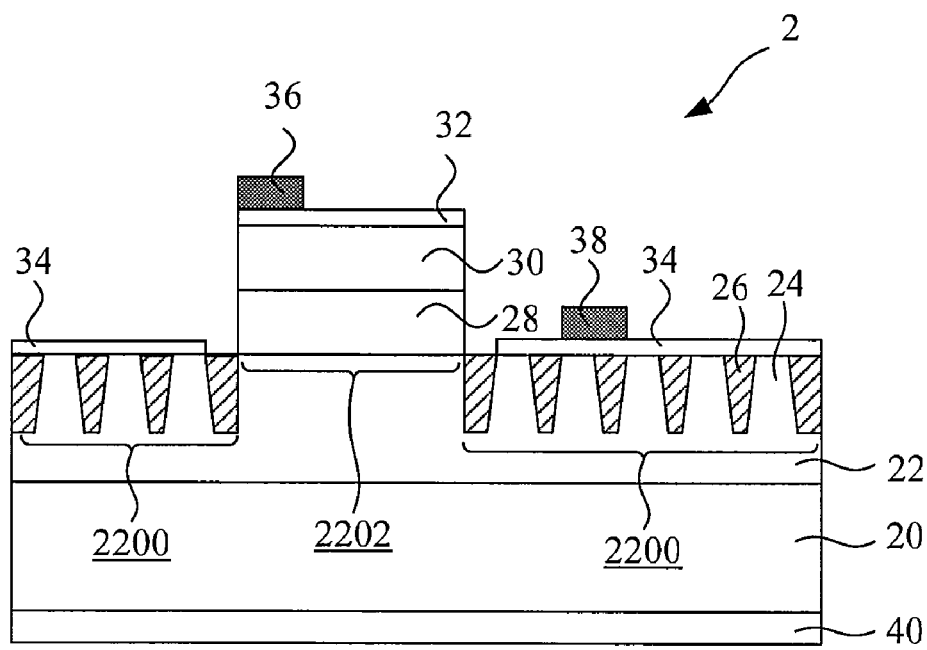
FIG. 2C is a sectional view illustrating each the plural pillars having a trapezoid shape.

It should be noted that the outlines of the plural pillars 24 can be further designed to increase the light-extraction efficiency of the diode. In a preferred embodiment, the surfaces of the plural pillars 24 and the first region 2200 are roughened, as shown in FIG. 2B. In another preferred embodiment, each the plural pillars 24 has a trapezoid shape in the cross-section view, as shown in FIG. 2C. In still another preferred embodiment, each the plural pillars 24 has a hollow structure.

Figure 2D:
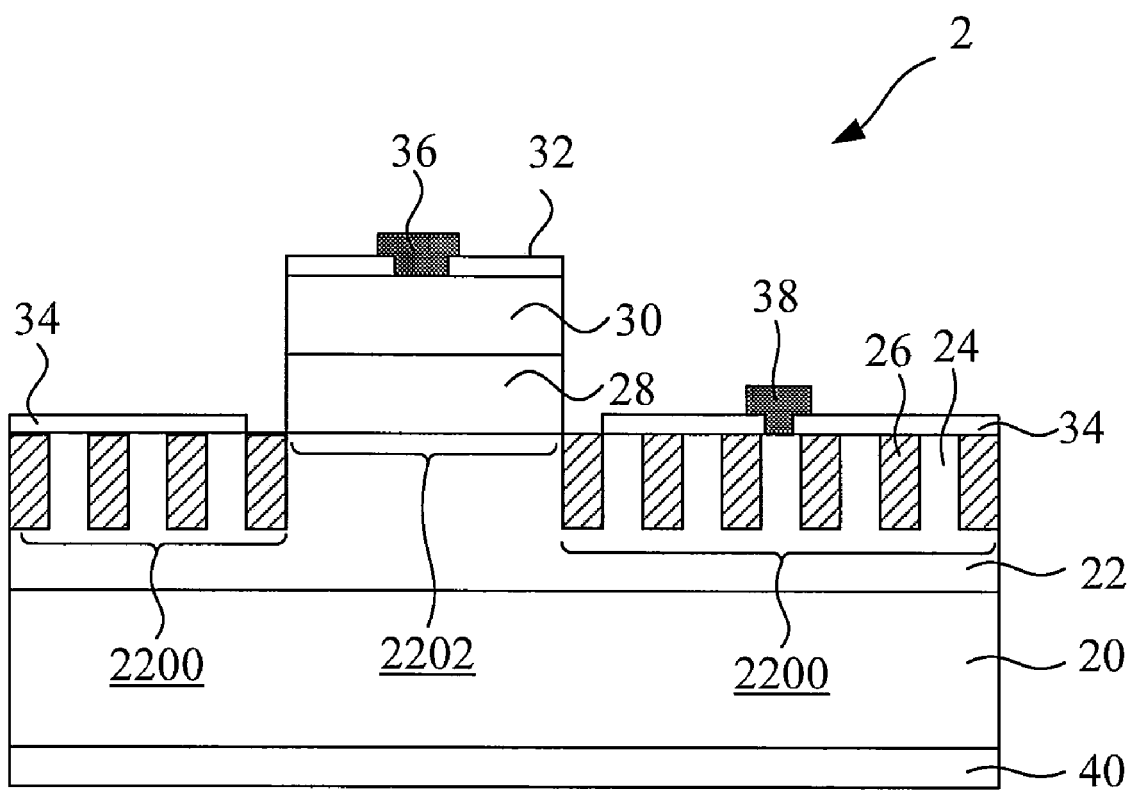
FIG. 2D is a sectional view illustrating the light-emitting diode in FIG. 2A in a preferred embodiment.

Please refer to FIG. 2D. FIG. 2D is a sectional view illustrating the light-emitting diode 2 in FIG. 2A in a preferred embodiment. As shown in FIG. 2D, a partial portion of the first transparent conducting layer 32 is removed, so that the top of the second conducting-type semiconductor layer 30 is exposed. The first electrode 36 is formed on the exposed top of the second conducting-type semiconductor layer 30 and contacts 30 and contacts the first transparent conducting layer 32. Besides, a partial portion of the second transparent conducting layer 34 is removed, so that the top of at least one pillar 24 is exposed. The second electrode 38 is formed on the exposed top of the at least one pillar 24 and contacts the second transparent conducting layer 34.

Please refer to FIGS. 3A through 3H. FIGS. 3A through 3H are sectional views illustrating a method for fabricating the light-emitting diode 2 in FIG. 2A.

Figure 3A:
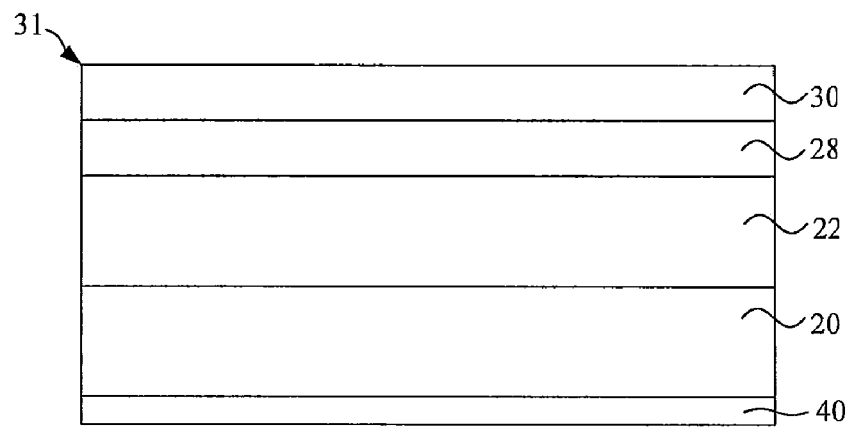
FIGS. 3A through 3H are sectional views illustrating a method for fabricating the light-emitting diode in FIG. 2A.

First, as shown in FIG. 3A, the first conducting-type semiconductor layer 22, the light-emitting layer 28 and the second conducting-type semiconductor layer 30 are formed in sequence on the substrate 20 to prepare a semiconductor laminated structure 31. In a preferred embodiment, the reflective layer 40 is further formed on the bottom surface of the substrate 20, which enables the light-emitting diode 2 to emit light upwardly.

Figure 3B:
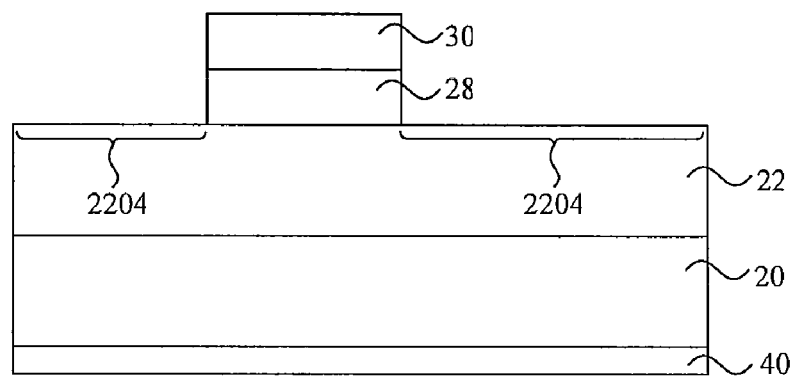

Then, as shown in FIG. 3B, a first etching is not applied on the semiconductor laminated structure 31 in FIG. 3A until a peripheral region 2204 of the top of the first conducting-type semiconductor layer 22 is exposed. Please refer to FIG. 3I which is the top view of the structure in FIG. 3B. It is particularly noted that the location of the dotted line in FIG. 3I can refer to where the dicing path on the substrate 20 is.

Figure 3C:
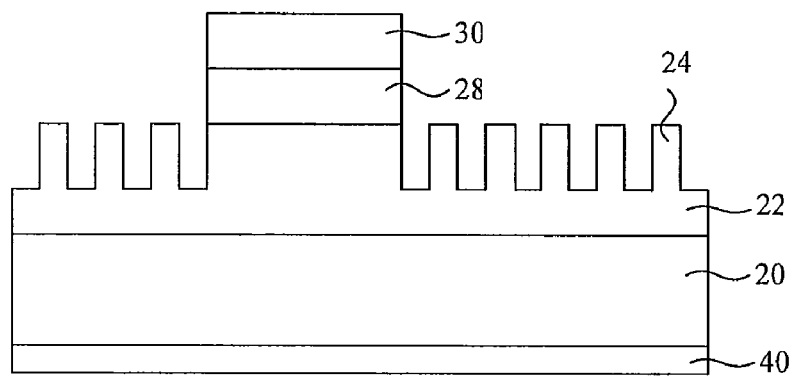

Subsequently, as shown in FIG. 3C, a second etching is applied on the peripheral region 2204 to form the plural pillars 24. Please refer to FIG. 3J which is the top view of the structure in FIG. 3C. The plural pillars 24 can be distributed uniformly on the peripheral region 2204. By comparison of FIG. 3I with FIG. 3J, most of the plural pillars 24 are located substantially over the dicing path.

In a preferred embodiment, the plural pillars 24 are arranged to form at least a ring surrounding the light-emitting layer, and each ring is constructed by connecting partial pillars with one other. As shown in FIG. 3K, the pillars 24 are arranged to form two concentric rings to ensure that light emitted from the light-emitting layer is totally totally guided to the emission plane of the device.

Figure 3D:
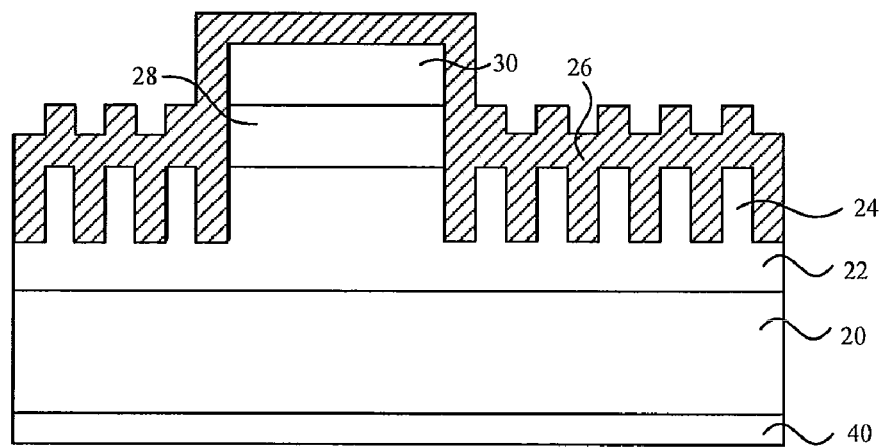

Subsequently, as shown in FIG. 3D, the transparent insulating material 26 is deposited on the whole structure in FIG. 3C, including being filled in the gaps between the pillars 24.

Figure 3E:
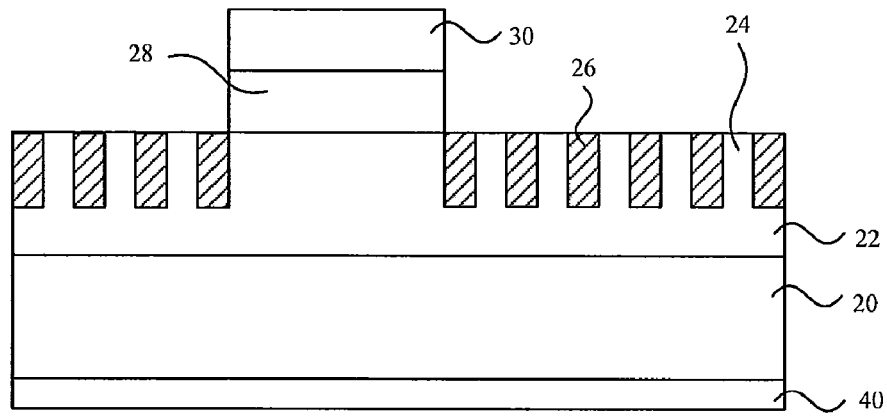

Next, as shown in FIG. 3E, a selective etching is applied to remove unwanted insulating material 26, so that the transparent insulating material 26 filled in the gaps between the pillars 24 is as high as the plural pillars 24.

Figure 3F:
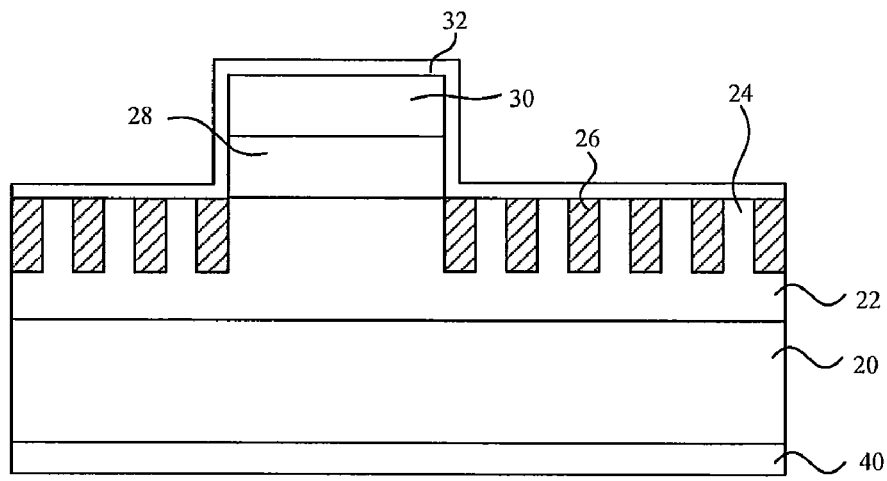

Subsequently, as shown in FIG. 3F, a transparent conducting layer 32 is deposited on the whole structure in FIG. 3E.

Figure 3G:
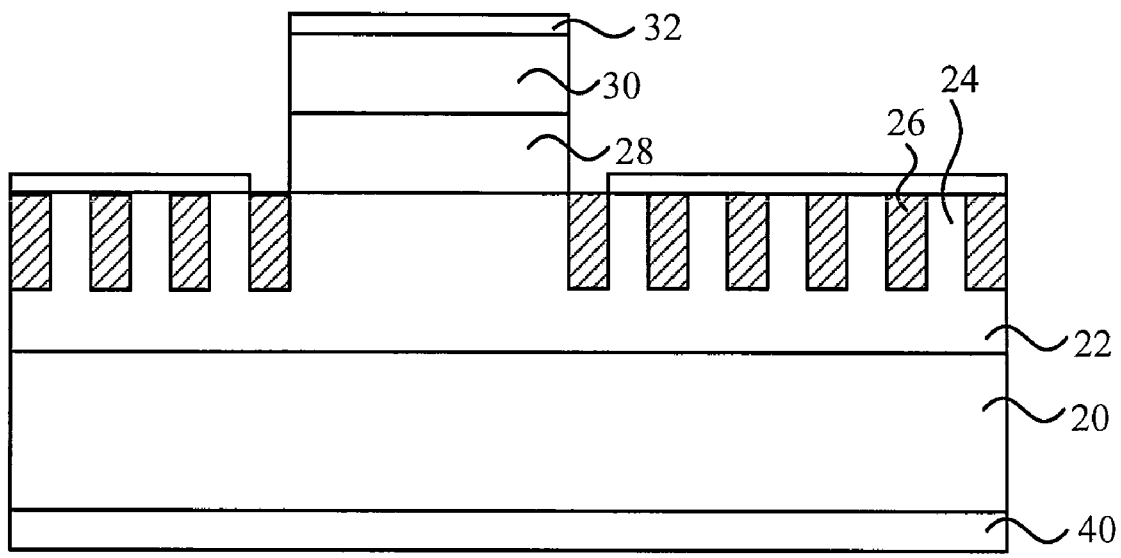

Subsequently, as shown in FIG. 3G, a selective etching is applied to remove the transparent conducting layer 32 formed on the sidewalls of the central laminated structure and the transparent conducting layer 32 formed between the central laminated structure and the plural pillars 24 in order to prevent current leakage.

Figure 3H:
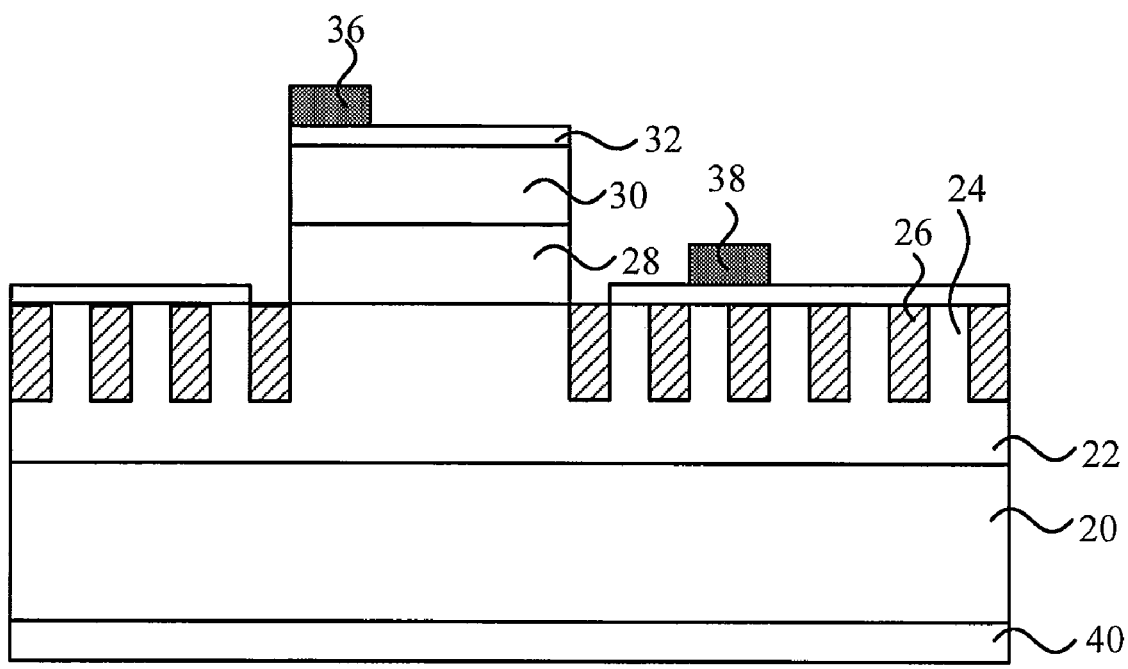
Figure 3I:
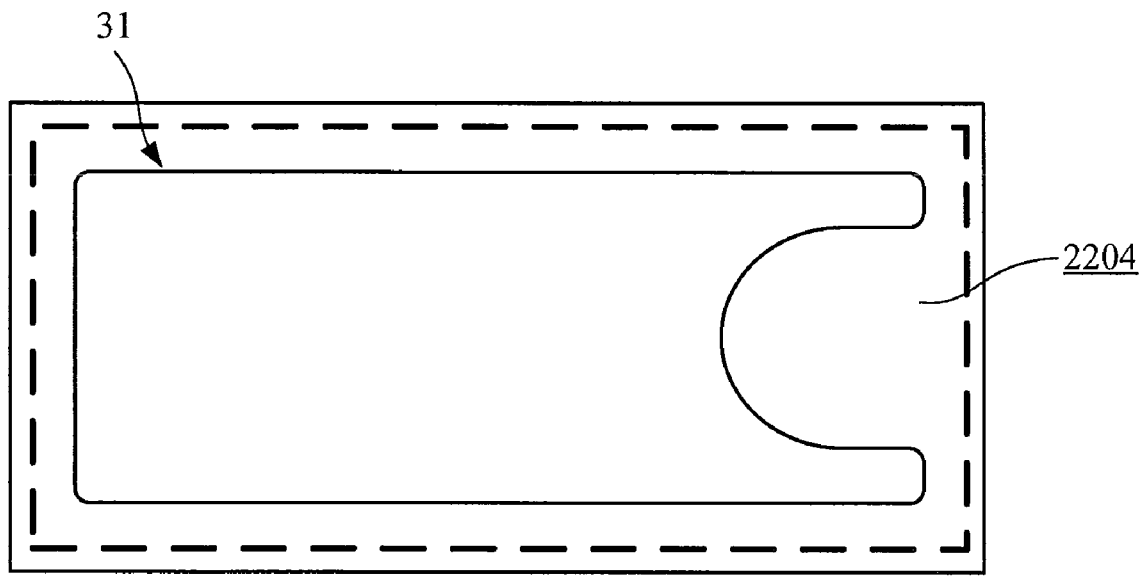
FIG. 3I is the top view of the structure in FIG. 3B.
Figure 3J:
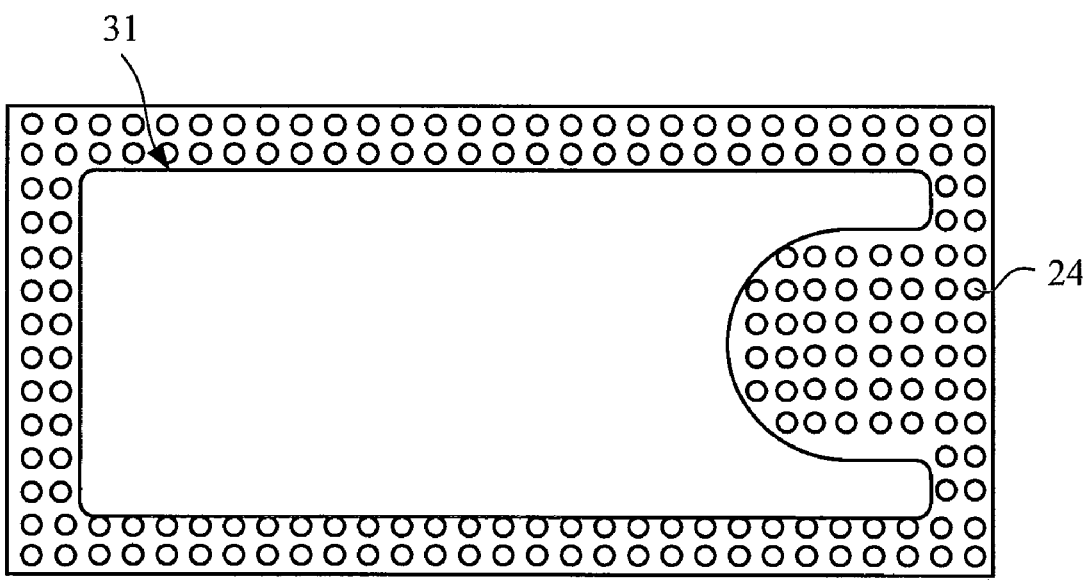
FIG. 3J is the top view of the structure in FIG. 3C.
Figure 3K:
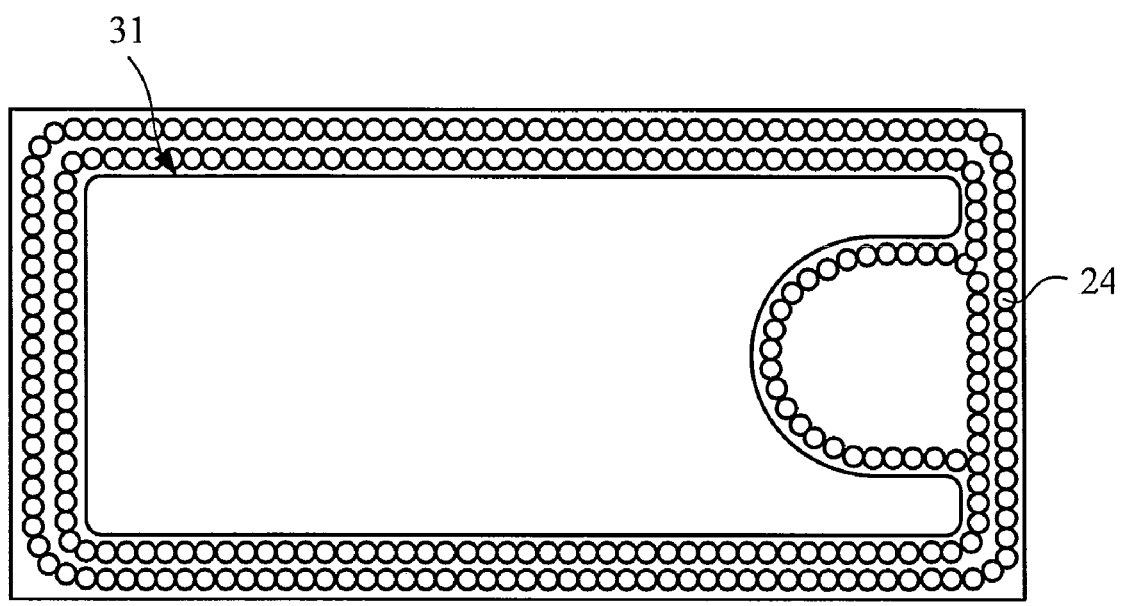
FIG. 3K is the top view of the pillars arranged to form two concentric rings.

Eventually, as shown in FIG. 3H, the first electrode 36 is formed on the transparent conducting layer 32 on the central laminated structure, and the second electrode 38 is formed on the transparent conducting layer 32 on the plural pillars 24.

Figure 4A:
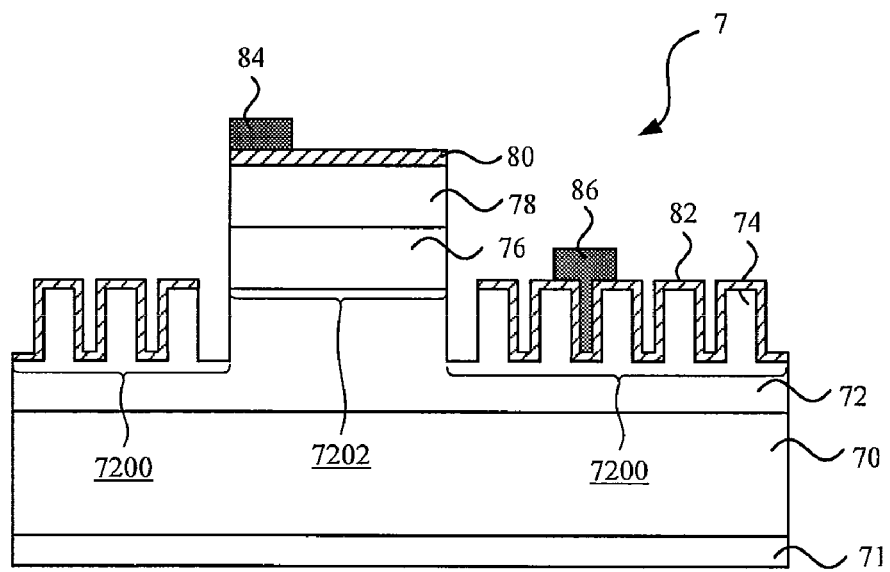
FIG. 4A is a sectional view illustrating a light-emitting diode according to an embodiment of the invention.

Please refer to FIG. 4A. FIG. 4A is a sectional view illustrating a light-emitting diode 7 according to an embodiment of the invention.

The light-emitting diode 7 includes a substrate 70, a first conducting-type semiconductor layer 72, plural pillars 74, a light-emitting layer 76, a second conducting-type semiconductor layer 78, a first transparent conducting layer 80, a second transparent conducting layer 82, a first electrode 84, and a second electrode 86. In practical applications, the substrate 70 thereon defines a dicing path (not shown in FIG. 4A), and most of the plural pillars 74 are located substantially over the dicing path.

As shown in FIG. 4A, the first conducting-type semiconductor layer 72 is formed on the substrate 70 and has a top surface including a first region 7200 and a second region 7202 surrounded by the first region 7200. The plural pillars 74 are formed on the first region 7200. In addition, the plural pillars 74 and the first conducting-type semiconductor layer 72 may be made of the same material.

Figure 4B:
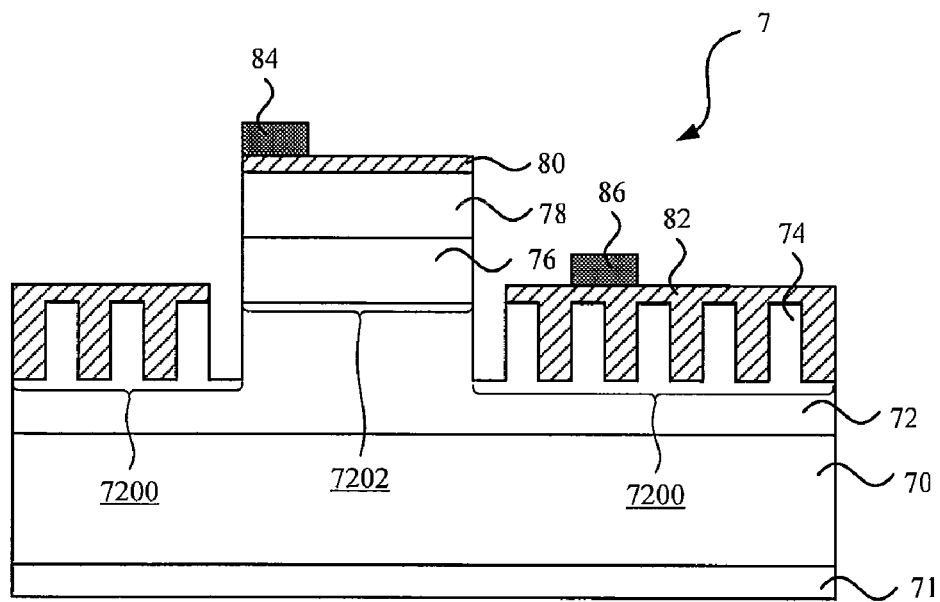
FIG. 4B is a sectional view illustrating a light-emitting diode according to an embodiment of the invention.

As shown in FIG. 4A, the light-emitting layer 76 is formed on the second region 7202, the second conducting-type semiconductor layer 78 is formed on the light-emitting layer 76, and the first transparent conducting layer 80 is formed on the second conducting-type semiconductor layer 78. In addition, the second transparent conducting layer 82 is coated on the pillars 74 and on the first region 7200. It is particularly noted that the second transparent conducting layer 82 can further be filled in the gaps between the pillars 74, as shown in FIG. 4B.

As shown in FIG. 4A, the first electrode 84 is formed on the first transparent conducting layer 80, and the second electrode 86 is formed on the second transparent conducting layer 82. In a preferred embodiment, the light-emitting diode 2 further includes a reflective layer 71, formed on the bottom surface of the substrate 70, which enables the light-emitting diode 7 to emit light upwardly.

It should be noted that the outlines of the plural pillars 74 can be further designed to increase the light-extraction efficiency of the diode. Please refer to FIG. 2B again. In a preferred embodiment, the surfaces of the plural pillars 74 and the first region 7200 are roughened. Please refer to FIG. 2C again. In another preferred embodiment, each of the plural pillars 74 has a trapezoid shape in the cross-section view. In still another preferred embodiment, each the plural pillars 74 has a hollow structure.

Figure 4C:
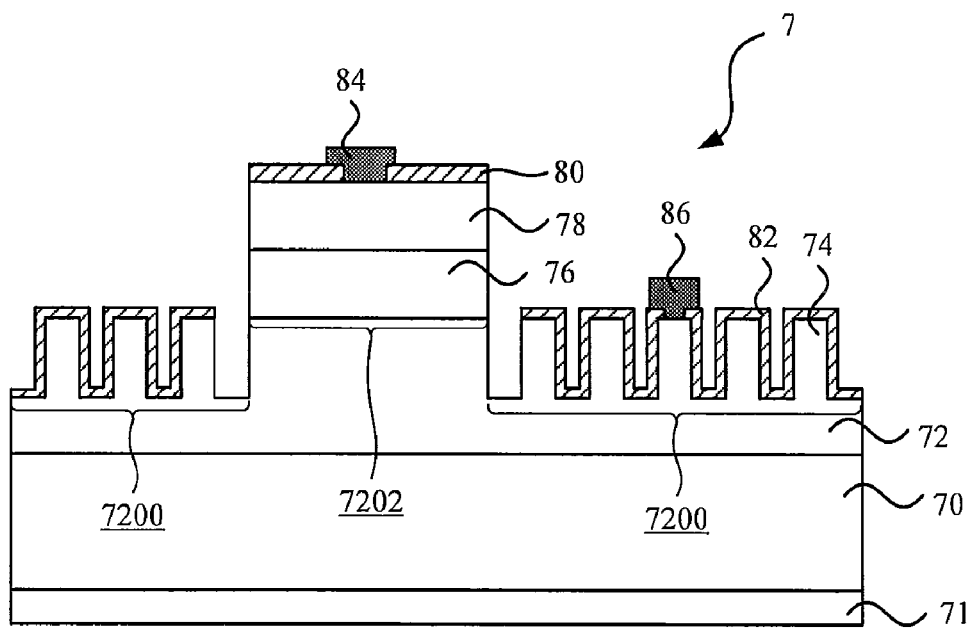
FIG. 4C is a sectional view illustrating the light-emitting diode in FIG. 4A in a preferred embodiment.
Figure 4D:
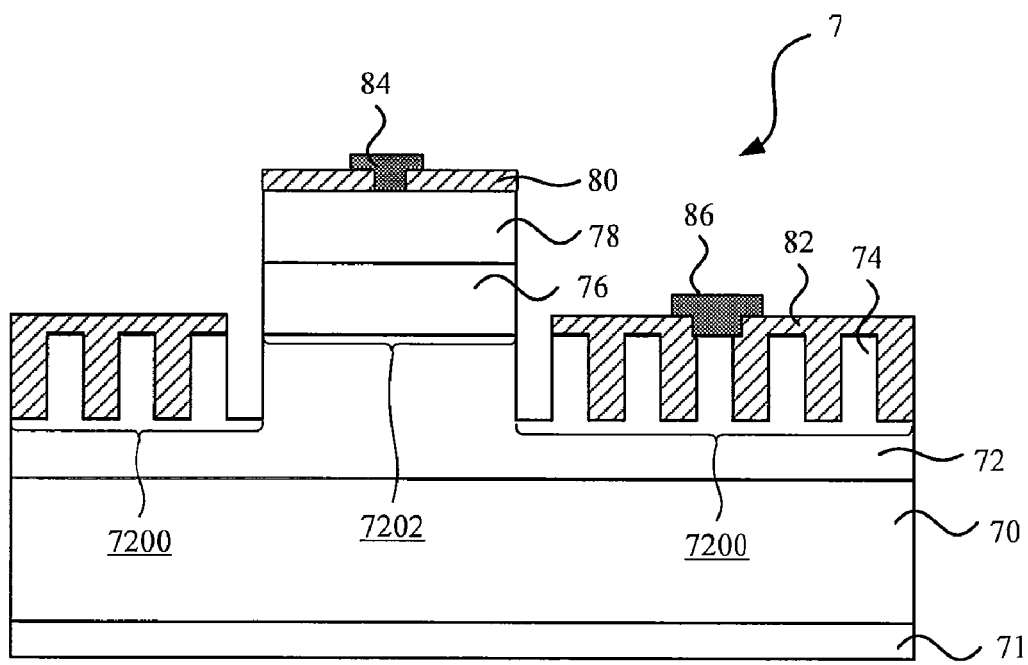
FIG. 4D is a sectional view illustrating the light-emitting diode in FIG. 4B in a preferred embodiment.

Please refer to FIG. 4C and FIG. 4D. FIG. 4C is a sectional view illustrating the light-emitting diode in FIG. 4A in a preferred embodiment.

As shown in FIG. 4C, a partial portion of the first transparent conducting layer 80 is removed, so that the top of the second conducting-type semiconductor layer 78 is exposed. The first electrode 84 is formed on the exposed top of the second conducting-type semiconductor layer 78 and contacts the first transparent conducting layer 80. Besides, a partial portion of the second transparent conducting layer 82 is removed, so that the top of at least one pillar 74 is exposed. The second electrode 86 is formed on the exposed top of the at least one pillar 74 and contacts the second transparent conducting layer 82. FIG. 4D is a sectional view illustrating the light-emitting diode in FIG. 4B in a preferred embodiment. Basically, the arrangements of the first electrode 84 and the second electrode 86 are identical both in FIG. 4C and FIG. 4D, so pertinent descriptions are not repeated.

Please refer to FIGS. 5A through 5F. FIGS. 5A through 5F are sectional views illustrating a method for fabricating the light-emitting diode in FIG. 4A.

Figure 5A:
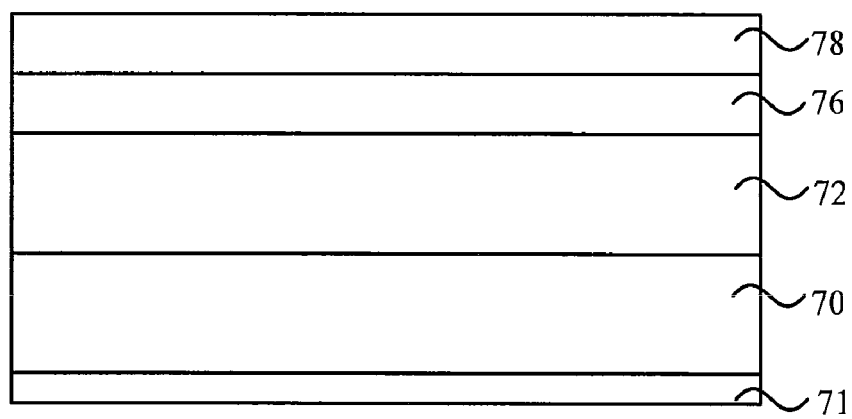
FIGS. 5A through 5F are sectional views illustrating a method for fabricating the light-emitting diode in FIG. 4A.

First, as shown in FIG. 5A, the first conducting-type semiconductor layer 72, the light-emitting layer 76 and the second conducting-type semiconductor layer 78 are formed in sequence on the substrate 70 to prepare a semiconductor laminated structure. In a preferred embodiment, the reflective layer 71 is further formed on the bottom surface of the substrate 70, which enables the light-emitting diode 7 to emit light upwardly.

Figure 5B:
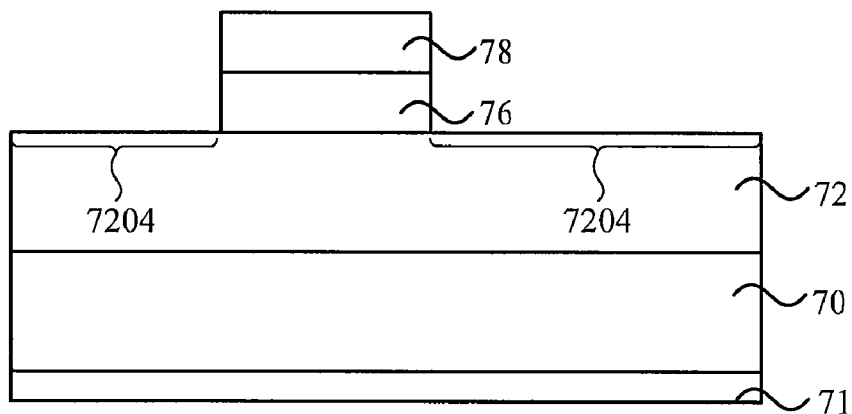

Then, as shown in FIG. 5B, a first etching is not applied on the semiconductor laminated structure in FIG. 5A until a peripheral region 7204 of the top of the first conducting-type semiconductor layer 72 is exposed.

Figure 5C:
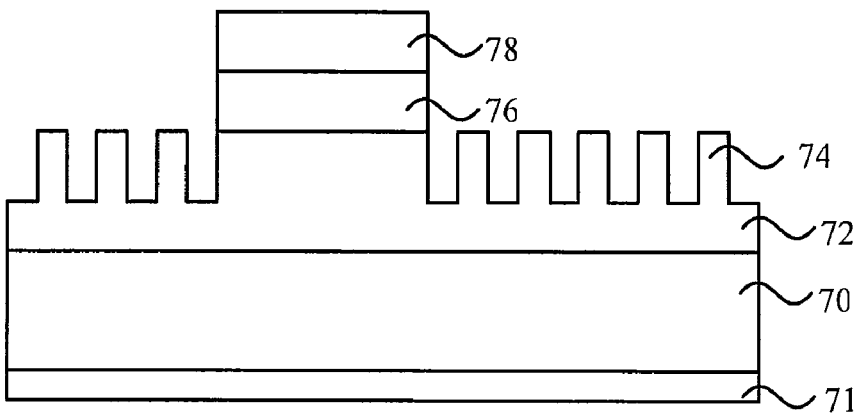

Subsequently, as shown in FIG. 5C, a second etching is applied on the peripheral region 7204 to form the plural pillars 74. In practical applications, the substrate 70 thereon defines a dicing path, and most of the plural pillars 74 are located substantially over the dicing path.

Please refer to FIG. 3J again. In a preferred embodiment, the plural pillars 74 can be distributed uniformly on the peripheral region. Otherwise, please refer to FIG. 3K again. In another preferred embodiment, the plural pillars 74 are arranged to form at least a ring surrounding the light-emitting layer, and each ring is constructed by connecting partial pillars with one other.

Figure 5D:
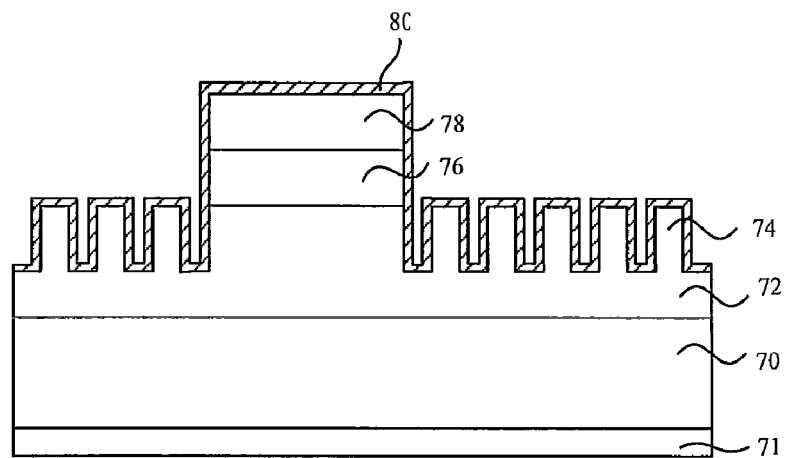

Subsequently, as shown in FIG. 5D, a transparent conducting layer 80 is deposited on the whole structure in FIG. 5C.

Figure 5E:
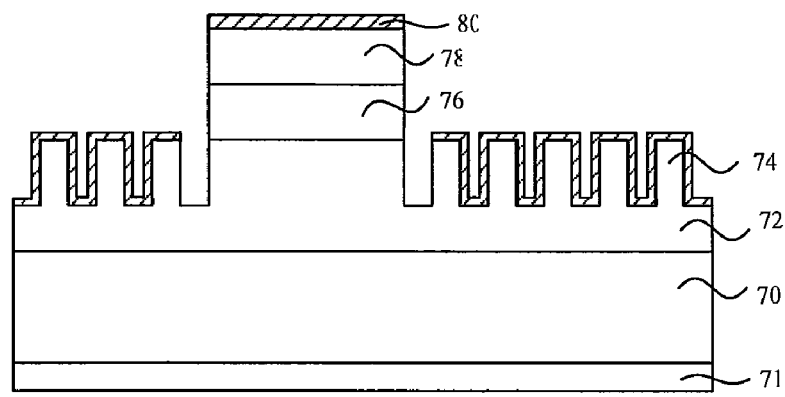

Subsequently, as shown in FIG. 5E, a selective etching is applied to remove the transparent conducting layer 80 formed on the sidewalls of the central laminated structure and the transparent conducting layer 80 formed in the gap between the central laminated structure and the plural pillars 74 in order to prevent current leakage. It is particularly noted that the transparent conducting layer 80 can further be filled in the gaps between the pillars 74, as shown in FIG. 4B.

Figure 5F:
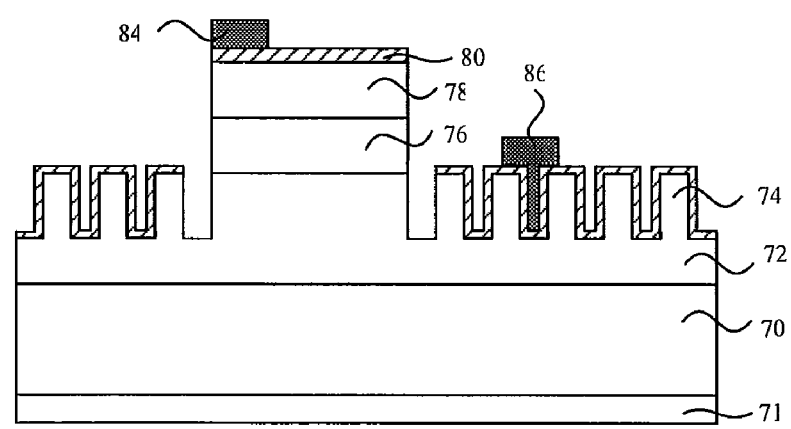

Eventually, as shown in FIG. 5F, the first electrode 84 is formed on the transparent conducting layer 80 on the central laminated structure, and the second electrode 86 is formed on the transparent conducting layer 80 on the plural pillars 74.

Compared to the prior art, the light-emitting diode according to the invention has increased light-extraction efficiency with the aforesaid plural pillars. Further, the transparent insulating material filled in the gaps between the pillars not only reduces the total reflection of light inside the light-emitting diode, but also enhances the anti-destruction strength of the device. Moreover, coating the transparent conducting layer on the pillars makes the driving current of the light-emitting diode flow into the pillars and thus spread around the primary illuminating region, which contributes to better current-spreading, more uniform illumination, and decreased instant discharge.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A light-emitting diode, comprising:
a substrate;
a first conducting-type semiconductor layer formed on the substrate and having a top surface comprising a first region and a second region surrounded by the first region;
plural pillars formed in the first region;
a transparent insulating material filled in the gaps between the pillars;
a light-emitting layer formed on the second region;
a second conducting-type semiconductor layer formed on the light-emitting layer;
a first transparent conducting layer formed on the second conducting-type semiconductor layer; and
a second transparent conducting layer formed on a top surface of the pillars and the transparent insulating material.

2. The light-emitting diode of claim 1, wherein the substrate thereon defines a dicing path, and the plural pillars are located substantially over the dicing path.

3. The light-emitting diode of claim 1, wherein each of the first conducting-type semiconductor layer, the light-emitting layer and the second conducting-type semiconductor layer is made of a nitride material.

4. The light-emitting diode of claim 3, wherein the refractive index of the transparent insulating material is between that of air and that of the nitride material.

5. The light-emitting diode of claim 1, further comprising a reflective layer formed on the bottom surface of the substrate.

6. The light-emitting diode of claim 1, wherein the plural pillars and the first conducting-type semiconductor layer are made of the same material.

7. The light-emitting diode of claim 1, wherein the surfaces of the plural pillars and the first region are roughened.

8. The light-emitting diode of claim 1, wherein each of the plural pillars has a trapezoid shape in the cross-section view.

9. The light-emitting diode of claim 1, wherein each of the plural pillars has a hollow structure.

10. The light-emitting diode of claim 1, wherein the plural pillars are arranged to form at least a ring surrounding the light-emitting layer, and each ring is constructed by connecting partial pillars with one other.

11. The light-emitting diode of claim 1, wherein the transparent insulating material is filled in the gaps between the pillars to be as high as the pillars.

12. The light-emitting diode of claim 1, further comprising a first electrode and a second electrode, wherein the first electrode is formed on the first transparent conducting layer, the second electrode is formed on the second transparent conducting layer.

13. The light-emitting diode of claim 1, further comprising a first electrode and a second electrode, wherein a partial portion of the first transparent conducting layer is removed, so that the top of the second conducting-type semiconductor layer is exposed, the first electrode is formed on the exposed top of the second conducting-type semiconductor layer and contacts the first transparent conducting layer, a partial portion of the second transparent conducting layer is removed, so that the top of at least one pillar is exposed, the second electrode is formed on the exposed top of the at least one pillar and contacts the second transparent conducting layer.

14. A light-emitting diode, comprising:
a substrate;
a first conducting-type semiconductor layer formed on the substrate and having a top surface comprising a first region and a second region surrounded by the first region;
plural pillars formed in the first region;
a transparent insulating material filled in the gaps between the pillars;
a light-emitting layer formed on the second region;
a second conducting-type semiconductor layer formed on the light-emitting layer;
a first transparent conducting layer formed on the second conducting-type semiconductor layer; and
a second transparent conducting layer coated on the pillars and on the first region.

15. The light-emitting diode of claim 14, wherein the substrate thereon defines a dicing path, and the plural pillars are located substantially over the dicing path.

16. The light-emitting diode of claim 14, wherein the second transparent conducting layer is further filled in the gaps between the pillars.

17. The light-emitting diode of claim 14, further comprising a reflective layer formed on the bottom surface of the substrate.

18. The light-emitting diode of claim 14, wherein the plural pillars and the first conducting-type semiconductor layer are made of the same material.

19. The light-emitting diode of claim 14, wherein the surfaces of the plural pillars and the first region are roughened.

20. The light-emitting diode of claim 14, wherein each of the plural pillars has a trapezoid shape in the cross-section view.

21. The light-emitting diode of claim 14, wherein each of the plural pillars has a hollow structure.

22. The light-emitting diode of claim 14, wherein the plural pillars are arranged to form at least a ring surrounding the light-emitting layer, and each ring is constructed by connecting partial pillars with one other.

23. The light-emitting diode of claim 14, further comprising a first electrode and a second electrode, wherein the first electrode is formed on the first transparent conducting layer, the second electrode is formed on the second transparent conducting layer.

24. The light-emitting diode of claim 14, further comprising a first electrode and a second electrode, wherein a partial portion of the first transparent conducting layer is removed, so that the top of the second conducting-type semiconductor layer is exposed, the first electrode is formed on the exposed top of the second conducting-type semiconductor layer and contacts the first transparent conducting layer, a partial portion of the second transparent conducting layer is removed, so that the top of at least one pillar is exposed, the second electrode is formed on the exposed top of the at least one pillar and contacts the second transparent transparent conducting layer.

* * * * *